(12) United States Patent
Araki et al.

(10) Patent No.: US 7,729,125 B2
(45) Date of Patent: Jun. 1, 2010

(54) ELECTRICAL CIRCUIT MODULE

(75) Inventors: Hideo Araki, Kawasaki (JP); Naoya Yamazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 811 days.

(21) Appl. No.: 11/591,535

(22) Filed: Nov. 2, 2006

(65) Prior Publication Data

US 2007/0103848 A1    May 10, 2007

(30) Foreign Application Priority Data

Nov. 4, 2005    (JP) ............................... 2005-320656

(51) Int. Cl.
*H05K 9/00* (2006.01)
(52) U.S. Cl. ................. 361/753; 361/799; 361/818; 361/816; 361/800; 174/350; 174/377
(58) Field of Classification Search ............. 361/753, 361/799, 800, 816, 818; 174/350
See application file for complete search history.

(56) References Cited

U.S. PATENT DOCUMENTS

| 6,135,793 | A   | * | 10/2000 | Babineau ................... 439/92 |
| 6,603,657 | B2  | * | 8/2003  | Tanzer et al. ............ 361/679.33 |
| 6,980,437 | B2  | * | 12/2005 | Bright ..................... 361/704 |
| 7,042,737 | B1  | * | 5/2006  | Woolsey et al. ............ 361/799 |
| 7,357,675 | B2  | * | 4/2008  | Barringer et al. ......... 439/607.3 |

FOREIGN PATENT DOCUMENTS

| JP | 63-182065 | 11/1988 |
| JP | 9-51185   | 2/1997  |

* cited by examiner

*Primary Examiner*—Dameon E Levi
(74) *Attorney, Agent, or Firm*—Staas & Halsey LLP

(57) ABSTRACT

A printed circuit board unit is configured so that, when a charged electrical circuit unit is electrically connected to the printed circuit board unit, first, the ground potential of the electrical circuit unit is dropped to the frame ground potential, and next, the ground potential of the electrical circuit unit is dropped to the ground potential of an electrical circuit on the printed circuit board unit.

18 Claims, 11 Drawing Sheets

ELECTRICAL CIRCUIT MODULE

BACKGROUND OF THE INVENTION

1. Field of the Invention

The present invention relates to an electrical circuit unit mounting mechanism on a printed circuit board.

2. Description of the Related Art

The electrical circuit unit with an electrical circuit is mounted on the printed circuit board unit with an electrical circuit to attach the electrical circuit unit. The electrical circuit has static electricity. Therefore when the electrical circuit unit mounts on the printed circuit board, the circuit must remove static electricity.

Hitherto, when an electrical circuit unit with an electrical circuit has been mounted on a printed circuit board unit, the electrical circuit unit has been grounded with respect to the ground of the printed circuit board unit. Known grounding arts are disclosed in Japanese Laid-Open Utility Model No. 63-182065 and Japanese Laid-Open Patent No. 09-051185.

Currently, there is a system that the electrical circuit unit with static electricity is mounted to the printed circuit board of an in-service. These prior art are not enough grounding for such system.

SUMMARY OF THE INVENTION

In accordance with one aspect of the invention, there is provided an electrical circuit module. The electrical circuit module has an electrical circuit unit, a frame and a printed circuit board. The electrical circuit unit has a first connector and a ground portion for grounding the electrical circuit, the ground portion being brought to frame ground potential. The frame has a first contact portion for contacting to the ground portion. The printed circuit board connects the electrical circuit unit. And the printed circuit board has a circuit ground potential for grounding the electrical circuit unit.

DESCRIPTION OF THE PREFERRED EMBODIMENT

An electronic device (for example an electrical circuit module) includes electrical circuit units (for example daughter boards) unitized according to the function in the device. The functions of these unitized daughter boards are combined so as to form a system to meet the system requirements of the user. In the case where the electronic device is, for example, a communication apparatus, it is necessary to add one or more units for extending the system and to pull out and insert one or more daughter boards for maintenance even when the system is in operation. If a daughter board charged with static electricity in the electrical circuit is electrically connected to a printed circuit board unit in operation, since the electrical circuit in the printed circuit board unit operates at the circuit ground, ground potential changes and failures occur in the system in operation. An object of the present invention is to prevent failures from occurring in the system in operation even if a daughter board is electrically connected to the printed circuit board unit in operation.

The structure of an apparatus to which the present invention is applied will hereinafter be described. Electronic devices, and in particular, transmission apparatuses used for optical wavelength multiplexing communication are different in terms of the numbers of lasers and light-receiving element units used for optical wavelength multiplexing, according to the scale of the system. Although the traffic of the transmission apparatuses is small at introduction, one or more units such as lasers can be added in anticipation of an increase in traffic after a few years.

Figure 1:
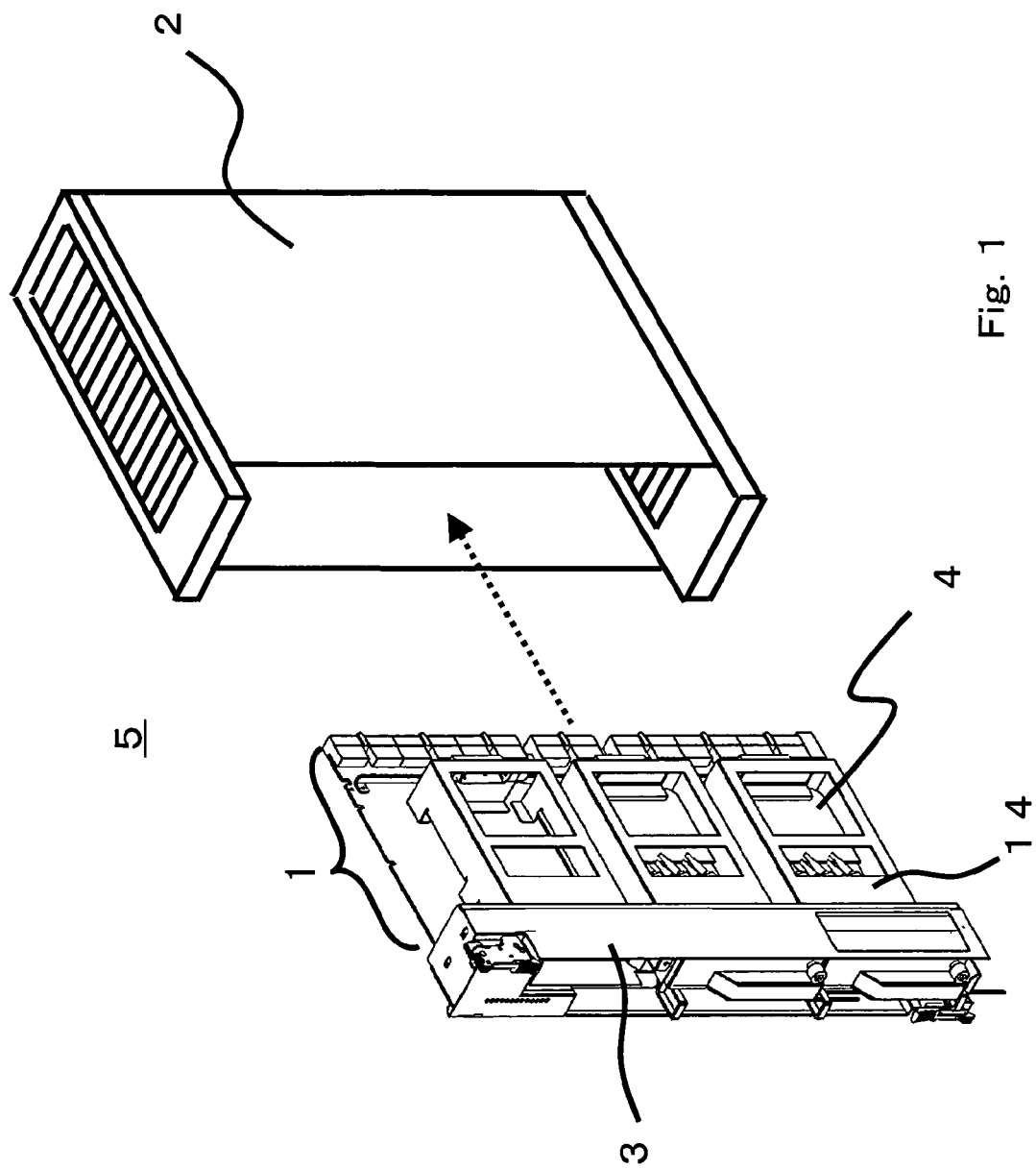
FIG. 1 shows the relationship between a printed circuit board unit and a case.

A transmission apparatus uses electrical circuit units unitized according to the function in the apparatus, as daughter boards. The functions of these unitized daughter boards are electrically or optically connected on a printed circuit board serving as a main board, and an electrical circuit module is thereby formed. This electrical circuit module is put in a rack, and the transmission apparatus is thereby formed. The embodiments of the present invention will hereinafter be described with reference to the drawings. FIG. 1 shows an electrical circuit module. The electrical circuit module 5 includes a printed circuit board unit 1, a case 2, and a frame 3. The printed circuit board unit 1 serving as a main board is held in the case 2. Although not shown, the case 2 has an opening on the back so that connectors provided at one end of the printed circuit board unit 1 can be connected to external connecters. The printed circuit board unit 1 has rails 14. The frame 3 is disposed at one end of the printed circuit board unit 1. The rails 14 are disposed behind the frame 3. The rails 14 hold an electrical circuit unit 4 serving as a daughter board with respect to the printed circuit board unit 1.

Figure 2:
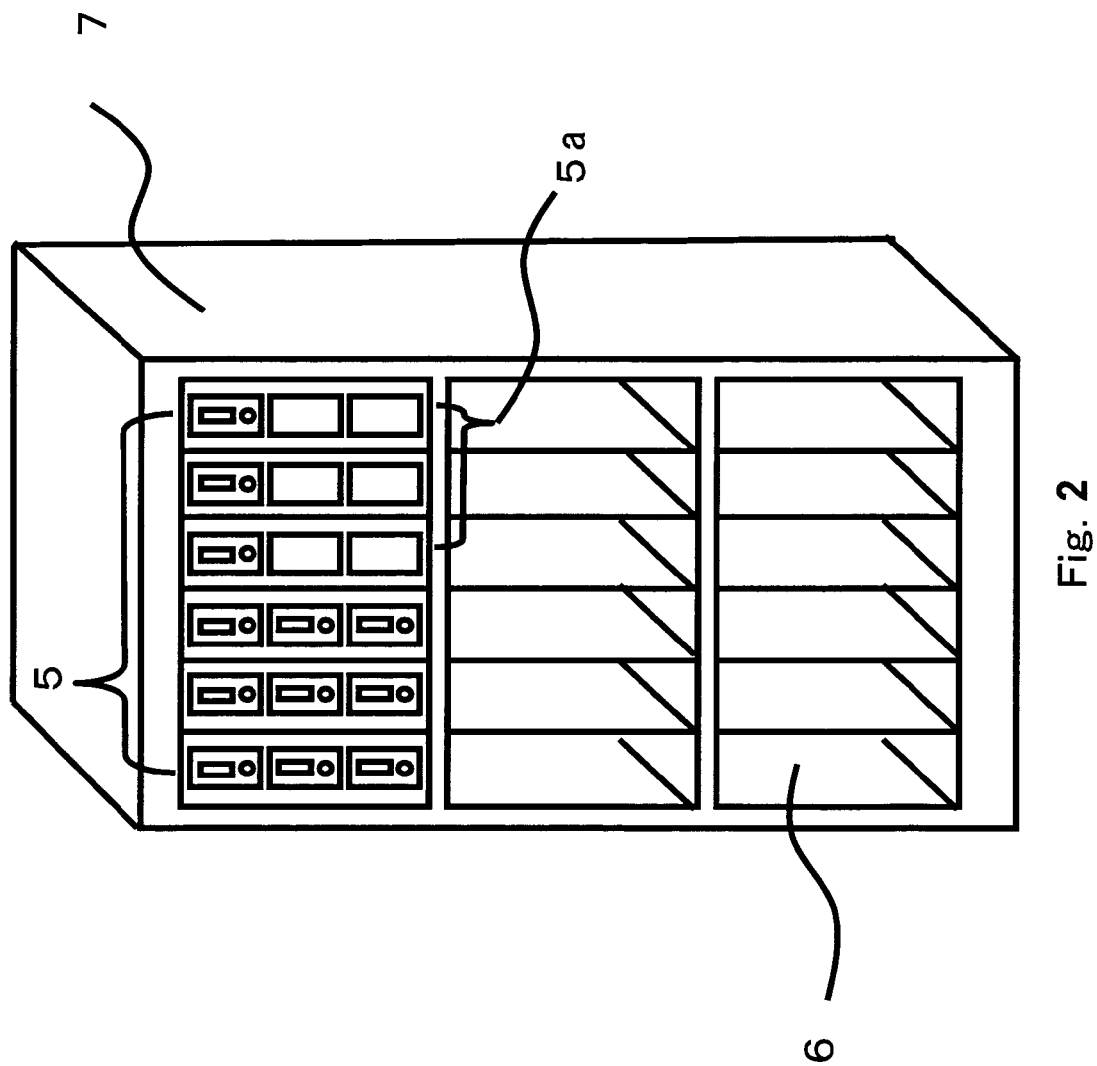
FIG. 2 shows the overall structure of an electronic device.

FIG. 2 shows the overall structure of an electronic device constituting a communication system. An electronic device 7 (communication system) has a rack 6 with a plurality of shelves. A plurality of electrical circuit modules 5 are inserted into the rack 6. The electrical circuit modules 5 have a printed circuit board unit 1 held in a case. A substrate having connectors is provided on the back of the electronic device 7. The connectors of the electronic device 7 are connected to connectors of the printed circuit board unit held in the case 2. With the above-described structure, the electronic device 7 constitutes a communication system. At first, the rack 6 of the electronic device 7 is provided with the electrical circuit modules 5 to meet the system requirements of the customer. One or more additional electrical circuit units 4 are provided in the electrical circuit modules 5a that have spaces into which an electrical circuit unit 4 can be inserted, according to the increase in traffic, with the electronic device 7 in service. In this structure, if necessary, one or more additional cases 2 are provided in one or more empty spaces of the rack 6.

Figure 3:
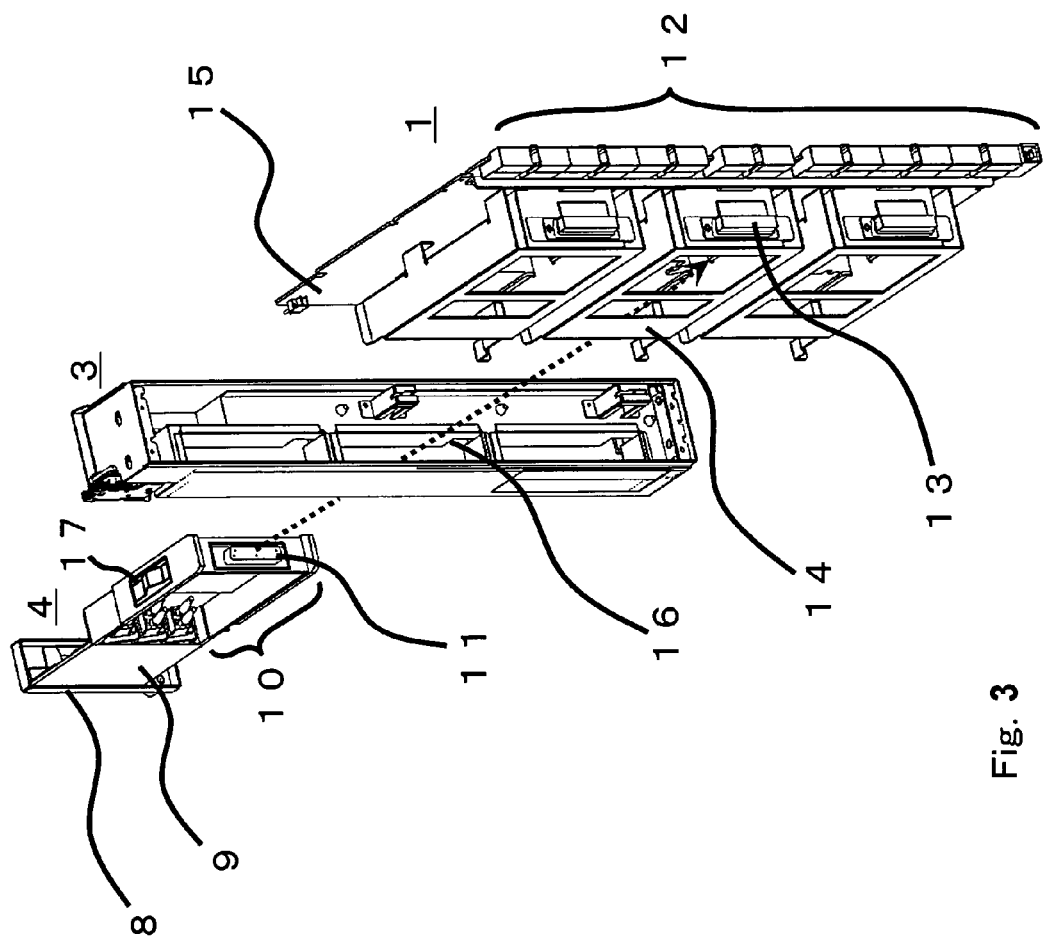
FIG. 3 shows the relationship among the printed circuit board unit, a frame, and an electrical circuit unit.

FIG. 3 shows the relationship among the printed circuit board unit, the frame, and the electrical circuit unit. The electrical circuit unit 4 includes a holding portion 8, an insulating substrate 9, and an electrical circuit portion 10. The electrical circuit portion 10 includes an electrical circuit, a connector 11, and grounding portion 17. The frame 3 includes contact portions 16. The printed circuit board unit 1 includes a printed circuit board 15, rails 14, and connectors 12 and 13. The electrical circuit portion 10 is fixed to one end of the insulating substrate 9, which is an insulator. The upper and lower (in the figure) surfaces of the electrical circuit portion 10 are provided with grounding portion 17. The holding portion 8 is fixed to the end of the insulating substrate 9 opposite the electrical circuit portion 10. The printed circuit board 15 is provided with a plurality of rails 14. The rails 14 have a guide space corresponding to the size of the electrical circuit unit 4. The guide space guides the electrical circuit unit 4 up to the end of the rail 14. The rails 14 have a connector 13 at the end. When the electrical circuit unit 4 is inserted into one of the rails 14 through the frame 3, the connector 11 of the electrical circuit unit 4 is engaged with one of the connectors 13 of the printed circuit board unit 1, at the end of the rail 14. The rails 14 are formed of metal and electrically connected to the ground of an electrical circuit of the printed circuit board unit 1.

The printed circuit board 15 has an electrical circuit on a substrate. The electrical circuit on the printed circuit board 15 constitutes a circuit together with the electrical circuit unit 4. When the electrical circuit of the printed circuit board 15 is in operation, the printed circuit board 15 has the electric potential of the circuit ground. Therefore, the electrical circuit unit 4 connected to the printed circuit board 15 with the connectors 11 and 13 operates at the circuit ground. The frame 3 is disposed at one end of the printed circuit board 15. The frame 3 has a plurality of openings for inserting the electrical circuit unit 4 in a connector-first direction. The openings have a contact portion 16 guiding the electrical circuit unit 4 to the rail. The frame 3 and the contact portions 16 are formed of metal. The frame 3 is inserted into and fixed to the case 2 formed of metal, thereby having the electric potential of the frame ground. The frame 3 also has a surface plate for covering the front of the case 2. The electrical circuit unit 4 is passed through one of the contact portions 16 of the frame 3 and then inserted into one of the rails 14 as shown by the dotted arrow.

Figure 4:
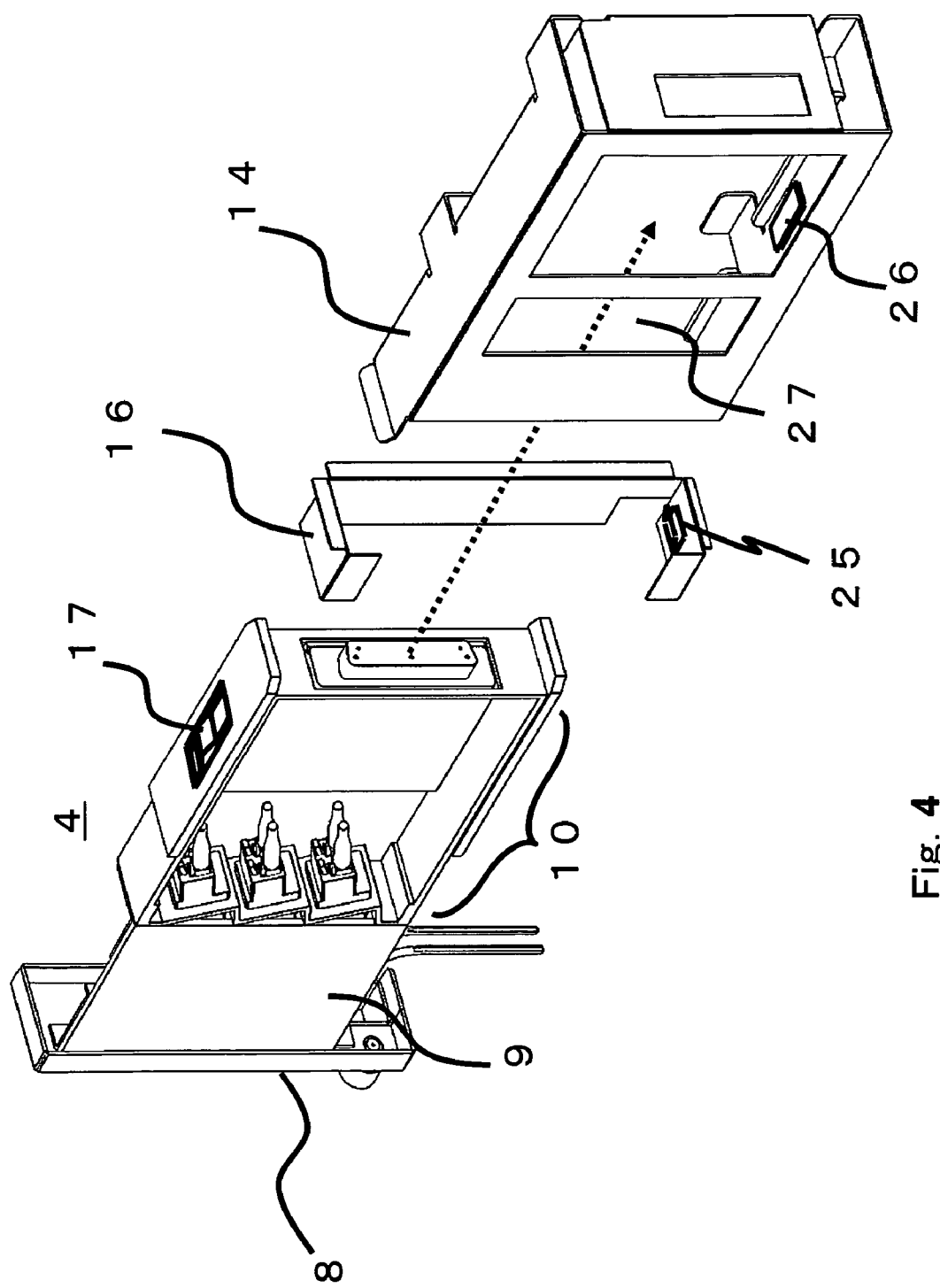
FIG. 4 shows the relationship among the electrical circuit unit, a contact portion, and a rail.

FIG. 4 shows the relationship among the electrical circuit unit, the contact portion, and the rail. The sequence of insertion of the electrical circuit unit 4 into the rail 14 provided in the printed circuit board unit will hereinafter be described.

(1) The electrical circuit unit 4 is inserted into one of the openings of the frame 3.

(2) When the electrical circuit portion 10 passes through the opening of the frame 3 by insertion of the electrical circuit unit 4, the contact portion 16 in the opening comes into contact with the grounding portion 17. Due to this contact, the static electricity charged in the electrical circuit portion 10 is discharged to the frame ground. The contact portion 16 has a spring 25 so as to come into contact with the grounding portion 17 of the electrical circuit portion 10.

(3) After the grounding portion 17 of the electrical circuit portion 10 passed through the contact portion 16, the grounding portion 17 is separated from the frame ground.

(4) After being inserted into the contact portion 16, the electrical circuit portion 10 is inserted into the guide space 27 of the rail 14.

(5-1) When the electrical circuit portion 10 is inserted up to the end of the rail 14, the connector 11 provided in the electrical circuit portion 10 is engaged with a connector of the rail 14. By this engagement, the electrical circuit of the electrical circuit portion 10 is connected to the ground of the printed circuit board 15 in operation through the connectors 11 and 13 and is brought to the circuit ground. Since the static electricity charged in the electrical circuit portion 10 is discharged to the frame ground when the electrical circuit portion 10 passes through the frame 3, the static electricity charged in the electrical circuit portion 10 does not adversely affect the circuit in operation.

(5-2) In (5-1), the static electricity in the electrical circuit portion 10 of the electrical circuit unit 4 is discharged to the circuit ground by using the connector 11 of the electrical circuit portion 10. However, it is also possible to discharge the static electricity in the electrical circuit portion 10 to the circuit ground by using the grounding portion 17 before the connector 11 comes into contact with the connector 13. Specifically, before the electrical circuit portion 10 is inserted up to the end of the rail 14, the grounding portion 17 come into contact with the contact portions 26 provided in the guide space 27 of the rail 14. The contact portions 26 are connected to the ground of the printed circuit board 15 directly or via the rail 14. Therefore, the static electricity in the electrical circuit portion 10 is discharged to the circuit ground before the connector 11 comes into contact with the connector 13.

(6) In operations (1) to (5-2), since the electrical circuit portion 10 and the holding portion 8 of the electrical circuit unit 4 are insulated by the insulating substrate 9, if a human holds the holding portion 8 and inserts the electrical circuit unit 4 into the rail 14, the static electricity charged in the human does not adversely affect the electrical circuit portion 10 and the electrical circuit on the printed circuit board 15. In addition, by being fixed to the frame 3, the holding portion 8 is grounded to the frame ground.

Figure 5:
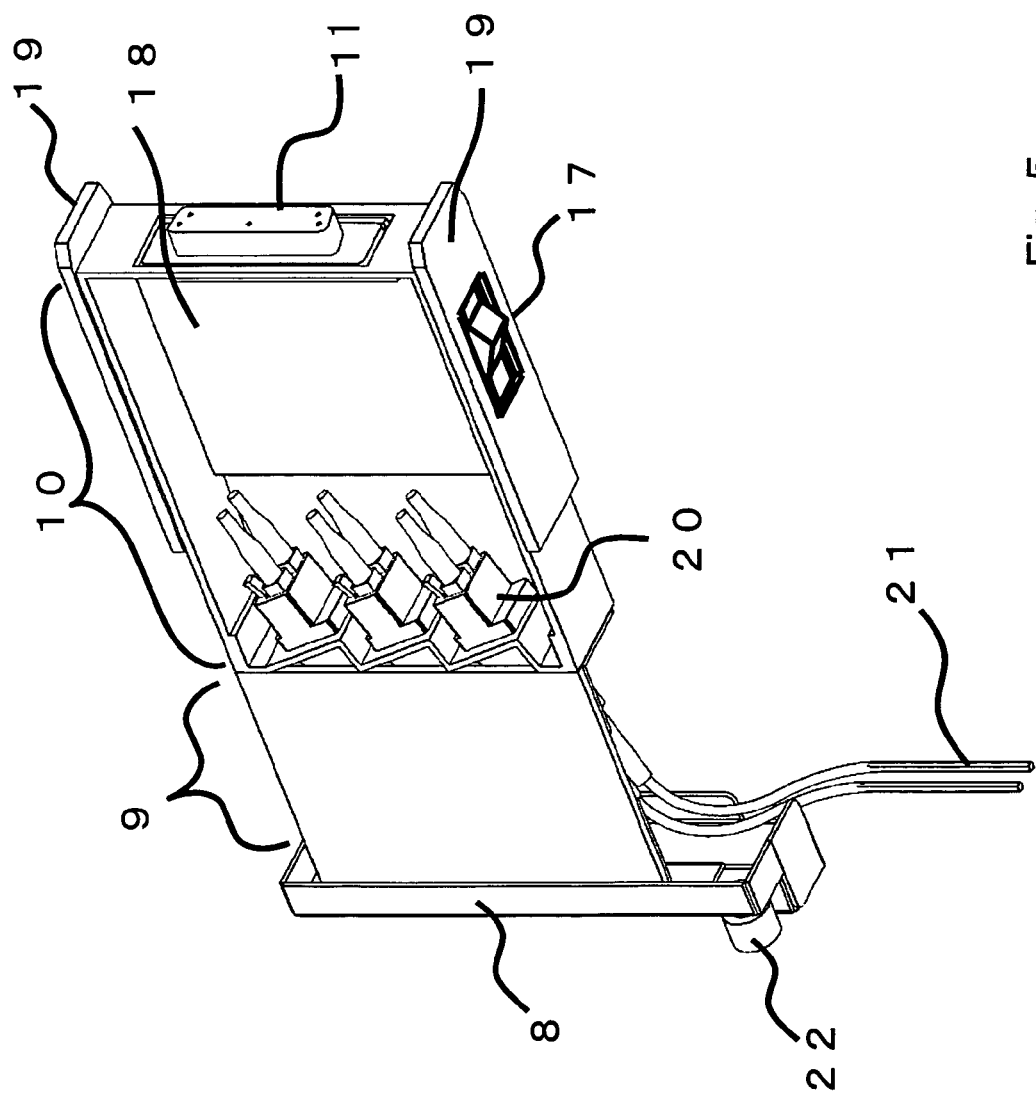
FIG. 5 shows the specific structure of the electrical circuit unit.
Figure 6:
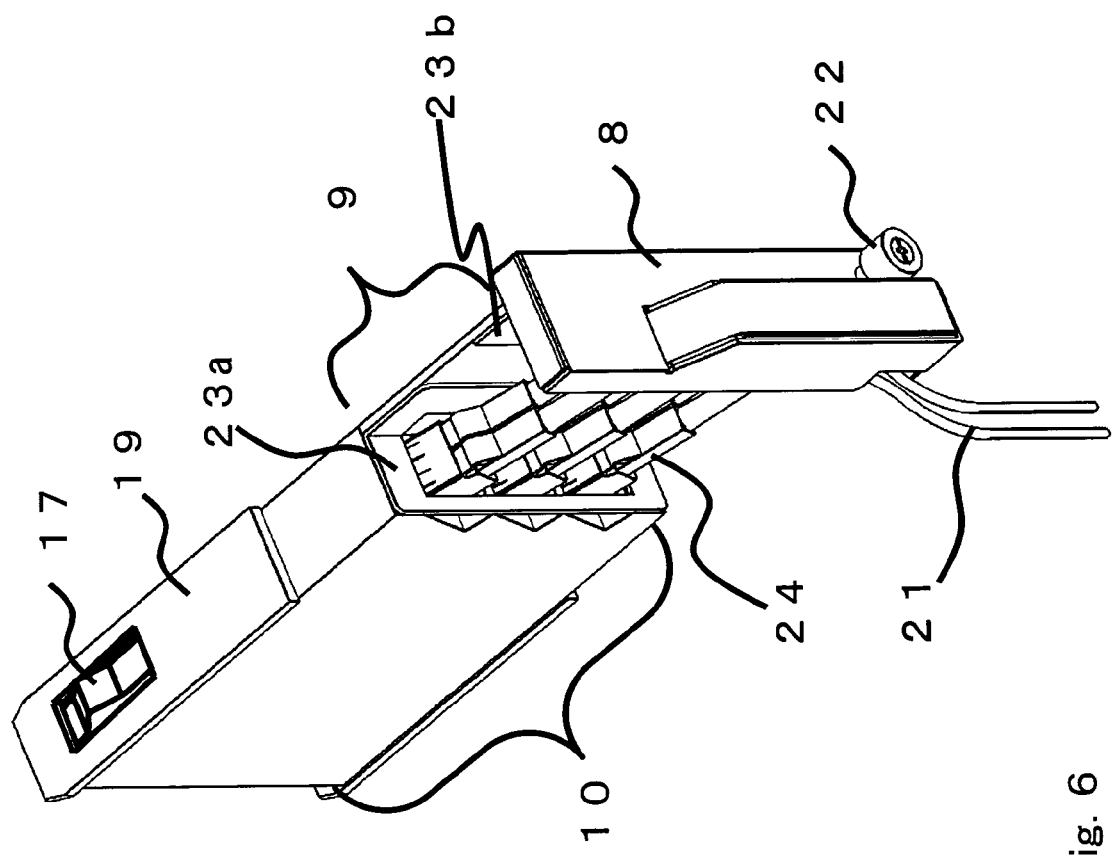
FIG. 6 shows the specific structure of the electrical circuit unit.

FIGS. 5 and 6 show the specific structure of the electrical circuit unit 4. The electrical circuit portion 10 is a metal case including an electrical circuit 18 mounted on a substrate. In addition, the electrical circuit portion 10 includes a connector 11 to be connected to the connector 13 provided in the rail 14 on the printed circuit board unit 1 serving as a mother board, and optical connector plugs 20 to which optical connectors 24 are connected. The optical connectors 24 hold optical fibers 21. In order to protect the connector 11, a connector protecting portion 19 is provided at both the top and bottom (in the figure) of the electrical circuit portion 10 so as to project more than the connector 11 does.

The electrical circuit 18 performs electrical processing for sending and receiving light to and from the optical connectors connected to the optical connector plugs 20. The grounding portion 17 is provided at both the top and bottom (in the figures) of the metal case. In the figures, the grounding portions 17 are formed by bending a metal piece so as to have elasticity. The grounding portions 17 are electrically connected to the ground of the electrical circuit 18. The insulating substrate 9 is formed of an insulating material. The electrical circuit portion 10 is fixed to one end of the insulating substrate 9 with an L-shaped fitting 23a. In addition, the holding portion 8 is fixed to the other end of the insulating substrate 9 with an L-shaped fitting 23b. The holding portion 8 is formed of metal and has a size covering one of the openings of the surface plate of the frame 3. The electrical circuit unit 4 is fixed to the surface plate of the frame 3 with a fixing screw 22 provided in the holding portion 8. The holding portion 8 is shaped like a lid with edges. One end of the contact portion 16 is fitted inside the edges of the holding portion 8. By this structure, electromagnetic waves generated in the printed circuit board unit 1 and the electrical circuit portion 10 are blocked from getting out.

Figure 7:
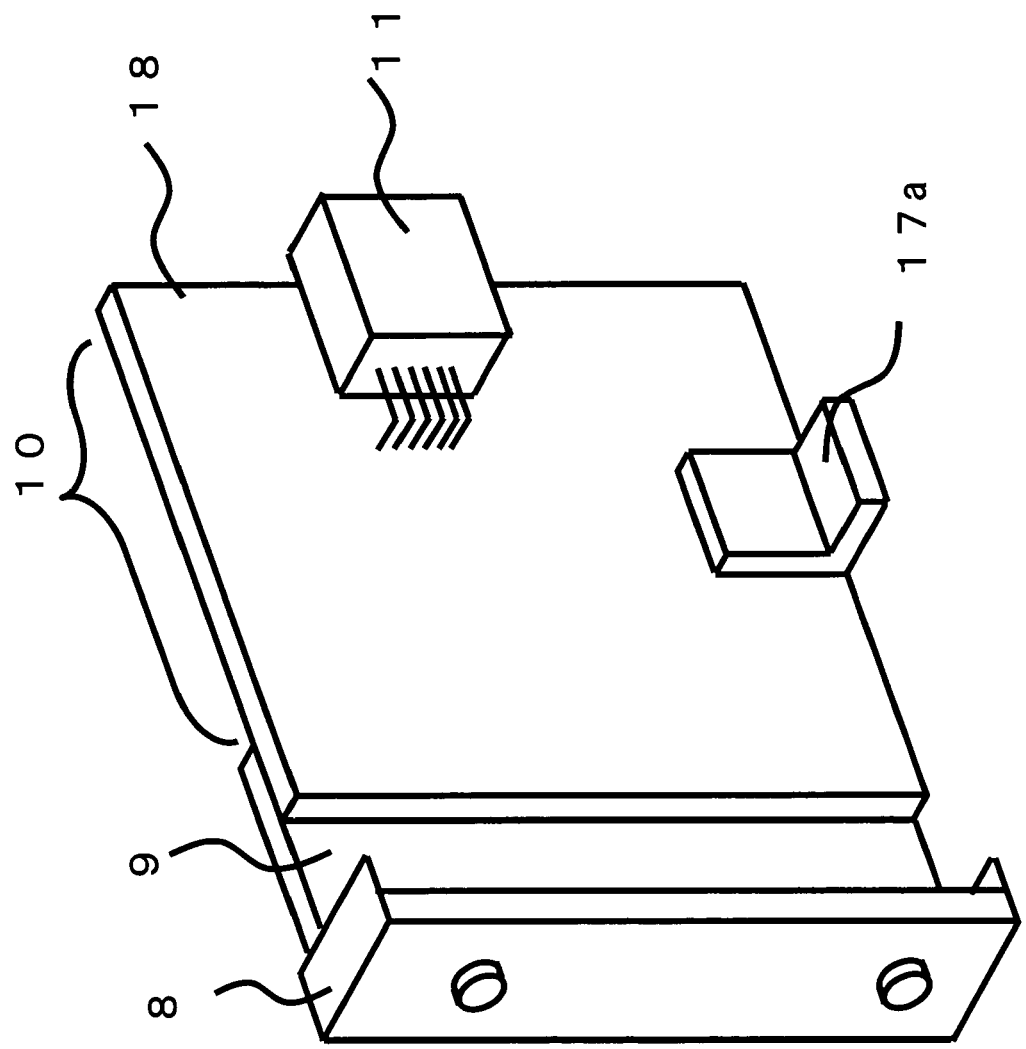
FIG. 7 shows the structure of another electrical circuit unit.

FIG. 7 also shows the structure of the electrical circuit unit 4. FIG. 7 shows a modification of the electrical circuit portion 10 in FIGS. 5 and 6. The changes will hereinafter be described. As for unchanged parts, description and illustration will be omitted. In the figure, the electrical circuit portion 10 has no metal case, and the electrical circuit 18 (a printed circuit board) is exposed. A metal fitting 17a provided on the substrate of the electrical circuit 18 serves as a grounding portion. Also in the structure of FIG. 7, the fitting 17a as a grounding portion is electrically connected to the ground of the electrical circuit 18. The part of the fitting 17a projecting from the electrical circuit 18 comes into contact with the contact portion 16 of the frame 3 and the contact portion 26 of the rail 14 or a contact portion electrically connected to the ground of the printed circuit board 15. This contact operation grounds the electrical circuit portion 10 in the same order as the above-described sequence of (1) to (6), in two stages.

Figure 8:
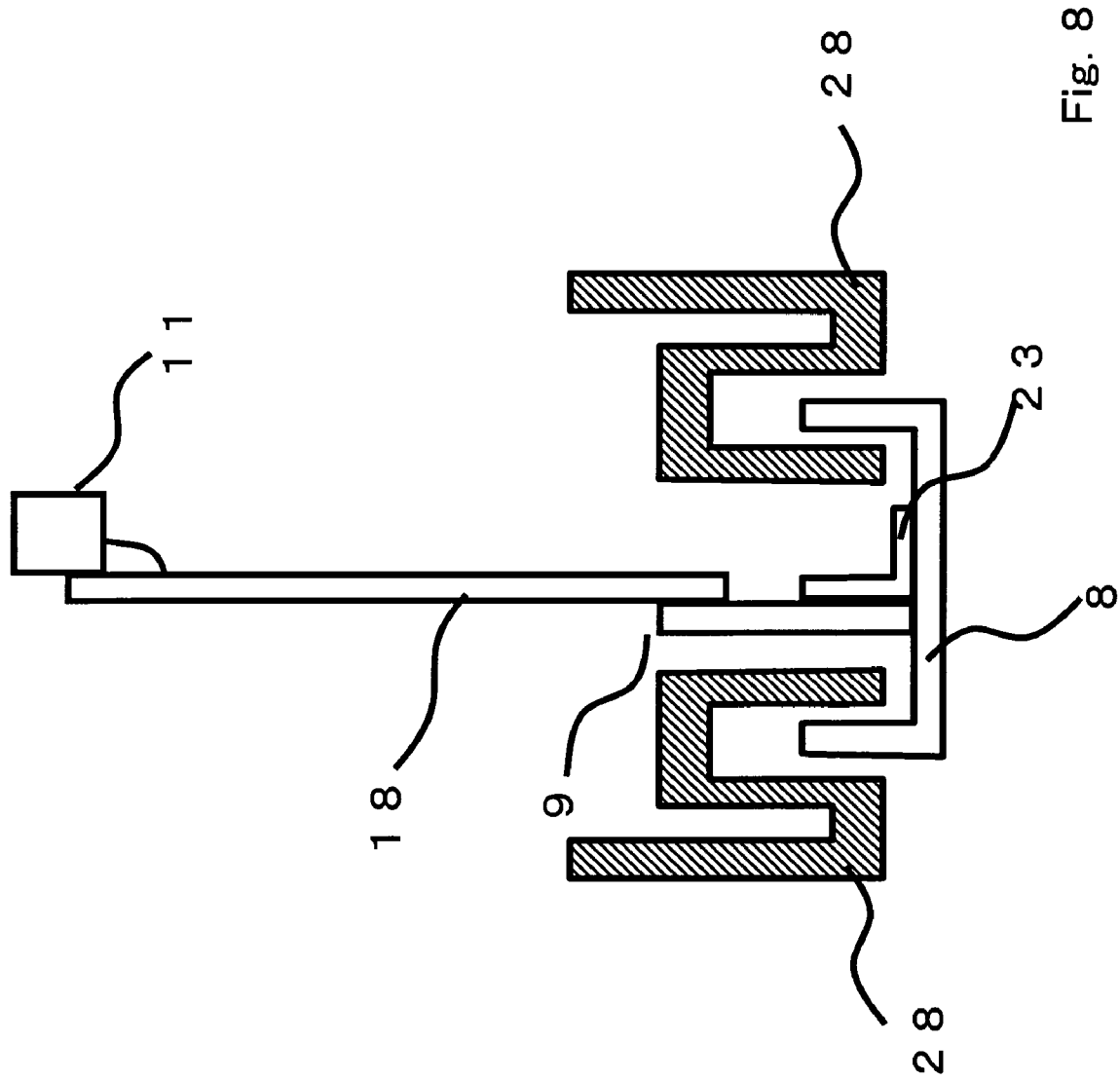
FIG. 8 shows the relationship between the frame and the holding portion.
Figure 9:
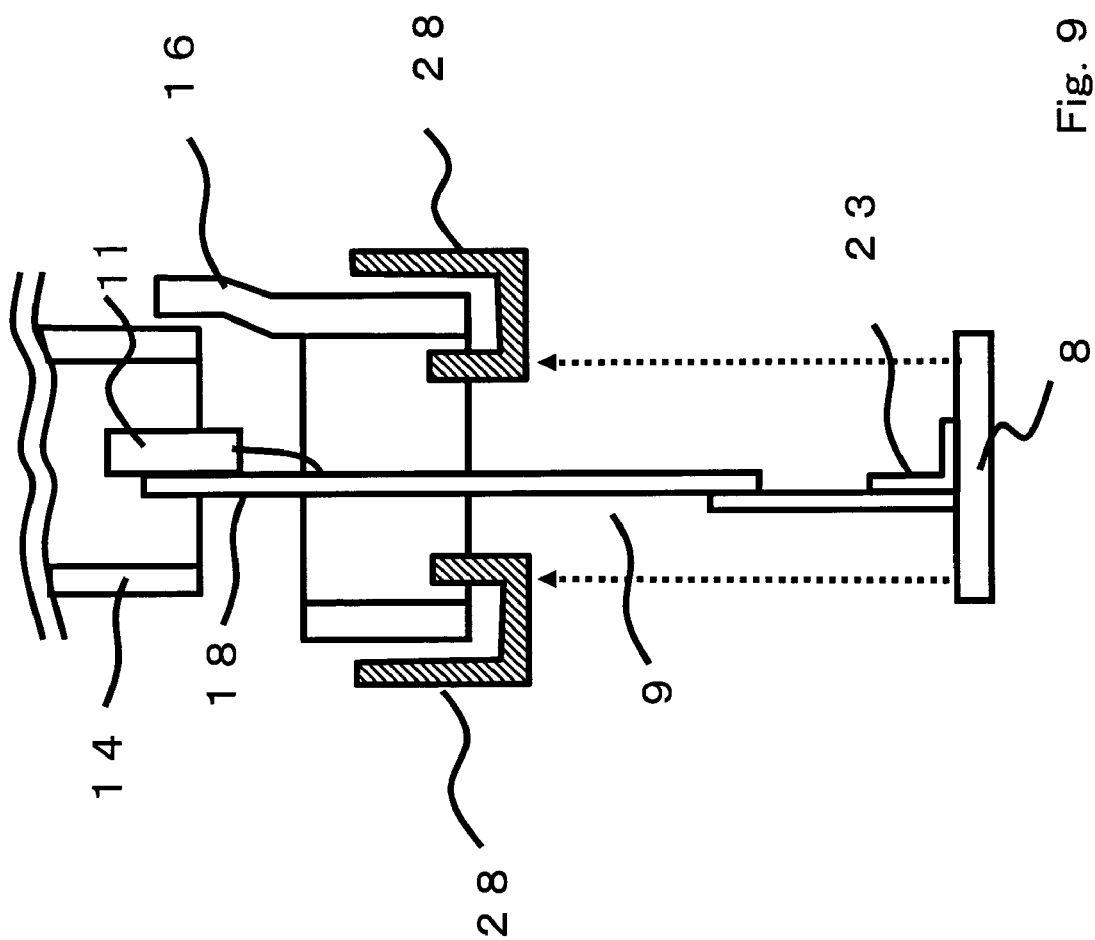
FIG. 9 shows the relationship between the frame and the holding portion.

FIGS. 8 and 9 show the relationship between the frame and the holding portion. FIGS. 8 and 9 show modifications of the structure shown in FIGS. 4, 5, and 6 using the structure of FIG. 7. In FIGS. 8 and 9, the same reference numerals will be used to designate the same components as those in FIGS. 4, 5, 6, and 7, so that the description will be omitted. In FIG. 4, the contact portion 16 of the frame 3 is fitted inside the edges of the holding portion 8. In FIG. 8, the surface plate 28 of the frame 3 has a folded structure, and the ends of the folded portions are fitted inside the edges of the holding portion 8. In FIG. 9, the surface plate 28 also has a folded structure. In FIG. 8, the ends of the folded portions of the surface plate 28 are fitted inside the edges of the holding portion 8. In contrast, in FIG. 9, the ends of the folded portions of the surface plate 28 are fitted inside the contact portion 16. In addition, at least part of the contact portion 16 is over the rail 14. In the case of FIG. 9, the holding portion 8 requires no edges and needs to be larger than one of the openings of the frame 3 so as to cover the opening. The structures of FIGS. 8 and 9 can stop electromagnetic waves generated in the electrical circuit from being emitted from the apparatus.

Figure 10:
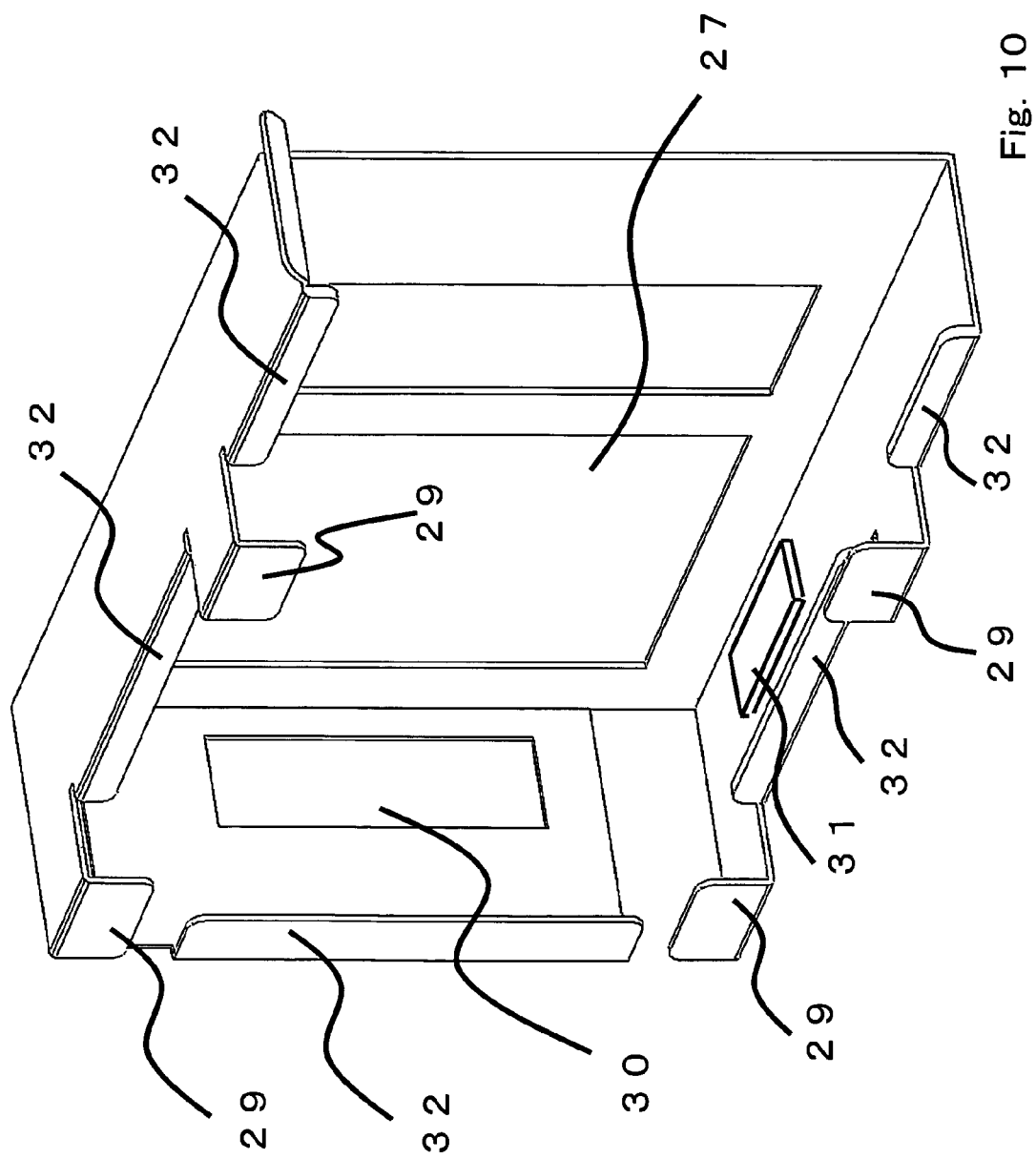
FIG. 10 shows the structure of the rail.
Figure 11:
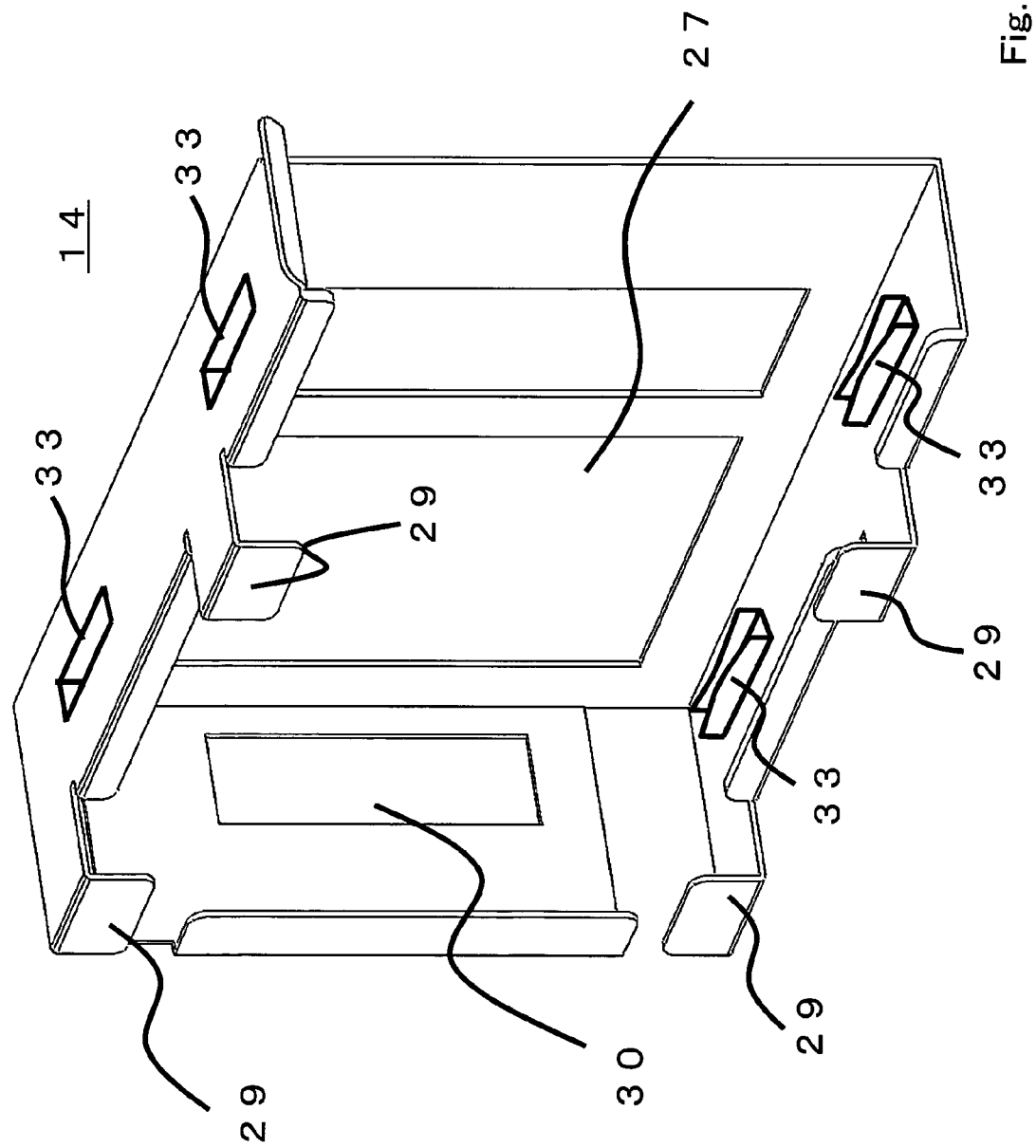
FIG. 11 shows the structure of the rail.

FIGS. 10 and 11 show the structure of the rail. FIG. 10 shows a rail 14 for holding the electrical circuit unit 4 of FIGS. 5 and 6. The rail 14 has feet 29 for fixing to the printed circuit board 15. The feet 29 are electrically connected to the ground of the printed circuit board 15. The edges of the rail 14 are bent so as to form electrical-circuit-unit supporting portions 32. These electrical-circuit-unit supporting portions 32 form the guide space 27. The electrical-circuit-unit supporting portions 32 guide the electrical circuit unit 4 to a connector-holding hole 30 in which the connector 13 is disposed. In addition, the surface of the rail 14 on the side of the guide space 27 is provided with contact portions 31. When the electrical circuit unit 4 is inserted, the contact portions 31 come into contact with the grounding portion, thereby grounding the static electricity charged in the electrical circuit unit 4.

FIG. 11 shows a rail 14 accommodating the electrical circuit unit 4 shown in FIGS. 7, 8, and 9. In order to guide the printed circuit board of the electrical circuit 18, parts of the rail 14 are cut and bent toward the guide space so as to form printed-board supporting portions 33, the width of the cut portions substantially corresponding to the thickness of the printed circuit board of the electrical circuit 18. Thus, the printed circuit board of the electrical circuit 18 can be supported. In addition, the printed-board supporting portions 33 serve as stoppers against which the fitting 17a of FIG. 7 is pressed. Thus, the connector portion can be prevented from being damaged by being excessively pressed when the electrical circuit unit 4 is inserted. The above-described embodiments can be appropriately combined if necessary.

When a daughter board is electrically connected to a printed circuit board unit during operation of a system in an electrical circuit module, the present invention makes it possible to ground an electrical circuit mounted on the daughter board to the frame ground once and then to the ground of a circuit mounted on the printed circuit board unit. Therefore, even if the daughter board is hot-plugged into the printed circuit board unit during operation of the circuit mounted on the printed circuit board unit, the present invention can reduce the change in the signal ground potential of the printed circuit board unit.

What is claimed is:

1. An electrical circuit module, comprising:
an electrical circuit unit having an electrical circuit and a ground portion for grounding the electrical circuit;
a frame having a first contact portion for contacting the ground portion and providing a first ground potential to the electrical circuit; and
a printed circuit board to which the electrical circuit unit is connected, the printed circuit board having the frame and a second ground potential for grounding the electrical circuit unit, wherein
the electrical circuit is inserted into an opening of the frame such that, when the electrical circuit unit passes through the opening of the frame, the ground portion of the electrical circuit unit contacts the first contact portion of the frame so as to ground the electrical circuit unit transiently.

2. The electrical circuit module according to the claim 1, wherein the electrical circuit unit is attachable to the printed circuit board after the ground portion contacts the first contact portion of the frame.

3. The electrical circuit module according to the claim 1, wherein the first ground potential is frame ground potential and the second ground potential is circuit ground potential.

4. The electrical circuit module according to the claim 1, wherein the electrical circuit has a first connector and the printed circuit board has a second connector providing the second ground potential for connecting to the first connector.

5. The electrical circuit module according to the claim 1, wherein the printed circuit board has a second contact portion providing the second ground potential for contacting the ground portion.

6. An electrical circuit module comprising:
an electrical circuit unit including:
an electrical circuit portion having an electrical circuit with a first connector and a ground portion for grounding the electrical circuit; and
a holding portion for holding the electrical circuit portion, the holding portion being electrically insulated from the electrical circuit portion;
a frame having a first contact portion formed by metal, the first contact portion contacting the ground portion; and
a printed circuit board unit including:
a guide portion for guiding the electrical circuit unit;
a second connector positioned at one end of the guide portion and electrically connected to the first connector; and
a printed circuit board for mounting the guide portion.

7. The electrical circuit module according to the claim 6, wherein the ground portion contacts the first contact portion.

8. The electrical circuit module according to the claim 6, wherein the electrical circuit potion is provided a first ground potential by contact of the grounding portion with the first contact portion, and a second ground potential by connecting the first connector to the second connector.

9. The electrical circuit module according to the claim 6, wherein the printed circuit board unit has a second contact portion contacting the ground portion, and the electrical circuit potion is brought to a first ground potential by contact of the ground portion with the first contact portion, and a second ground potential by connecting the second contact portion to the ground portion.

10. The electrical circuit module according to the claim 6, wherein the frame has a spring for pressing the electrical circuit unit.

11. The electrical circuit module according to the claim 6, wherein the frame is formed of metal.

12. The electrical circuit module according to the claim 6, wherein the ground portion forms a metal plate.

13. The electrical circuit module according to the claim 6, wherein the frame has an opening for inserting the electrical circuit unit and the holding portion is fitted in the opening.

14. The electrical circuit module according to the claim 13, wherein the frame and the holding portion are formed by metal.

15. The electrical circuit module according to the claim 6, wherein the electrical circuit unit is attachable to the printed circuit board unit after contact of the ground portion with the first contact portion of the frame.

16. A mounting method for mounting an electrical circuit unit to a working printed circuit boards comprising:
    passing the electrical circuit unit through an opening of the frame mounted on the printed circuit board so as to ground the electrical circuit unit by contacting a ground portion of the electrical circuit unit with a contact portion of the frame; and
    attaching the electrical circuit unit to the printed circuit board after passing the electrical circuit unit through the opening of the frame.

17. The mounting method according to the claim 16, further comprising:
    grounding the electrical circuit to a first ground potential when inserting.

18. The mounting method according to the claim 16, further comprising:
    grounding the electrical circuit to a second ground potential when attaching.

* * * * *

UNITED STATES PATENT AND TRADEMARK OFFICE
CERTIFICATE OF CORRECTION

PATENT NO.        : 7,729,125 B2
APPLICATION NO.   : 11/591535
DATED             : June 1, 2010
INVENTOR(S)       : Hideo Araki et al.

It is certified that error appears in the above-identified patent and that said Letters Patent is hereby corrected as shown below:

Column 6, Line 66 delete "potion" and insert --portion--.

Column 7, Line 6 delete "potion" and insert --portion--.

Column 8, Line 6 delete "boards" and insert --board--.

Signed and Sealed this

Seventh Day of December, 2010

David J. Kappos
*Director of the United States Patent and Trademark Office*